United States Patent [19]
Mottel et al.

[11] 3,932,716
[45] Jan. 13, 1976

[54] LATCH AND SWITCH ACTUATOR INTERLOCK SAFETY STRUCTURE FOR ELECTRONIC COMPONENT MODULE OPERABLE DURING INSERTION AND REMOVAL OF CONNECTOR MEMBERS

[75] Inventors: Samuel Mottel, New Providence; David Howard Williamson, Whippany, both of N.J.

[73] Assignee: Bell Telephone Laboratories, Incorporated, Murray Hill, N.J.

[22] Filed: July 15, 1974

[21] Appl. No.: 488,783

[52] U.S. Cl................. 200/50 A; 317/99; 317/120
[51] Int. Cl.² ........................................ H01H 9/20
[58] Field of Search .......................... 200/321–327, 200/329–340, 50 A, 50 B; 317/99, 100, 317/101 R, 101 CB, 101 D, 101 DH, 112, 317/120; 312/320

[56] References Cited
UNITED STATES PATENTS

| | | | |
|---|---|---|---|
| 2,227,967 | 1/1941 | Favre | 317/120 X |
| 2,388,675 | 11/1945 | Chapman et al. | 317/120 |
| 2,530,945 | 11/1950 | Chapman et al. | 317/120 X |
| 2,802,972 | 8/1957 | Warrington | 317/99 X |
| 2,970,243 | 1/1961 | Riesz et al. | 317/99 |
| 3,213,224 | 10/1965 | Mrenna et al. | 200/50 A |
| 3,384,722 | 5/1968 | Hanke et al. | 200/50 A |
| 3,674,962 | 7/1972 | Kroeger | 200/321 |
| 3,715,552 | 2/1973 | Umezu et al. | 200/50 A X |
| 3,715,554 | 2/1973 | Umezu et al. | 200/50 A X |

*Primary Examiner*—James R. Scott
*Attorney, Agent, or Firm*—J. S. Cubert

[57] ABSTRACT

An actuator controlled switch mounted on an electronic component module is operative to remove electrical power from the module during plug-in or removal of the module from a support frame. A latch and the actuator are pivotally mounted in parallel relation on the module and the latch is urged against a fixed support frame member. During plug-in and removal, a lateral extension of the latch forces the actuator to hold the module switch off. When the module is fully engaged, the latch is removably displaced from the actuator whereby the actutor can be pivoted to turn the module switch on and off.

12 Claims, 5 Drawing Figures

LATCH AND SWITCH ACTUATOR INTERLOCK SAFETY STRUCTURE FOR ELECTRONIC COMPONENT MODULE OPERABLE DURING INSERTION AND REMOVAL OF CONNECTOR MEMBERS

BACKGROUND OF THE INVENTION

Our invention is related to rack mounting arrangements for an electronic component chassis and more particularly to arrangements for protecting chassis components during insertion and removal of the chassis from its associated rack mounting.

In modern electronic systems, it is a general practice to construct small portions of an electronic system on individual chassis or printed circuit modules. Each module includes a connection member which is received by a mating connection member mounted on the support frame assembly. The assembly rack includes the wiring between its module connecting members whereby a plurality of modules are electrically interconnected to perform the system functions. The module and rack connecting members are designed to provide low resistance and electrically and mechanically reliable interconnections between the module and the support assembly rack. During insertion and removal of the module connecting member from its position in the mating rack connector, electrical transients may occur. Such transients can cause damage to the connecting members and the module components and are particularly troublesome in the case of modules which carry high voltages and high currents, such as power supply or power regulator modules. In prior known arrangements, either the power is removed from the rack assembly preparatory to the insertion or removal of modules or special switching apparatus is included whereby the operator can remove power from a module prior to its insertion or removal. These priorly known systems are generally not economical or convenient and rely on operator control.

It is an object of the invention to provide for automatic removal of power from an electronic component module during its insertion and removal from an electronic rack assembly.

It is another object of the invention to provide a mechanical assembly on a component module for automatically removing power from the module connecting member to prevent damage to the connecting member from electrical transients resulting from insertion and removal.

It is yet another object of the invention to provide an economic latch and switch actuator mechanism on the component module, which mechanism interacts with the associated rack assembly to electrically disconnect power from the module connecting member thereby preventing electrical transient damage during insertion and removal of the module from the rack assembly.

It is yet another object of the invention to provide a latch and switch actuator mechanism on an electric component module adapted to lock the module into its associated rack and to allow application and removal of power from the module when the module is connected to its associated rack and further adapted to automatically remove power from the module during insertion and removal of the module connecting member from the rack assembly connecting member.

BRIEF SUMMARY OF THE INVENTION

Our invention is a switch assembly adapted to remove power from an electronic component assembly during engagement and disengagement of the module with a support frame. The module includes a switch device fixedly mounted on said module which is movable between an ON condition and an OFF condition. A switch actuator, pivotally mounted on said module and movably engaged with said switch device, pivots between a first position holding said switch device in its ON condition and a second position holding said switch device in its OFF condition. Means are provided to restrict the actuator to its second position during the insertion and removal of said module.

According to one aspect of the invention, a latch and switch actuator is adapted to maintain a switching device mounted on an electronic component module in an OFF state during the engagement and disengagement of said module from a rack assembly. The latch is pivotally mounted on the module and forced against an adjacent rack frame member during the engagement and disengagement. The switch actuator is operative in a first position to put said switching device in its ON state and in a second position to put said switching device in its OFF state and is pivotally mounted in relation to said latch on the module. When the module connection member is fully connected with the rack assembly connection member, a notched portion of said latch engages the adjacent frame member and the switch actuator is freely movable between its first and second positions. During engagement and disengagement of the module, the switch actuator is forced into its second position by the latch engagement with the adjacent rack member whereby the switching device is held in its OFF state. The switching device is electrically connected to the module so that no power can be applied to the module during engagement and disengagement. But the switching device is freely operable to control application of electrical power when the module is in its connected condition.

According to another aspect of the invention, the latch is spring loaded against the rack frame member and a lateral portion of the latch extends over the adjacent switch actuator to hold the switch actuator in its second position during engagement and disengagement. When the module is in its connected position, the notched portion of the latch is forcibly engaged against the adjacent rack frame member. The lateral portion of the latch is thereby removably displaced from the actuator so that the switch actuator can be moved between its first and second positions.

According to another aspect of the invention, the latch and the switch actuator are rotatably mounted on a common pivot attached to the module. The switch actuator includes a first extension portion on one side of the pivot, said first extension portion being adjacent to and in generally parallel relation to said latch. A second switch actuator extension on the opposite side of said common pivot includes a recessed end, into which recessed end a movable member of the switching device is inserted. The recessed end of the switch actuator forces the switching device movable member into its OFF position responsive to the latch being in contact with the adjacent frame member during engagement and disengagement. When the module is in its connected position, the latch is removably displaced from the actuator responsive to the notched portion of the latch being engaged with the adjacent frame member and the switch actuator is freely movable between its first and second position.

According to yet another aspect of the invention the notched section of the latch includes an angular side in contact with the fixed support frame member and a horizontal portion which is spring loaded against the adjacent fixed support frame member when the module is fully connected to the rack assembly. The notched section of the latch is adapted to hold the module in a locked position when the module is fully connected to the rack assembly. The latch may be pivoted counterclockwise to remove the notched section from contact with the adjacent fixed support frame member. The downward displacement of the latch permits disengagement of the module from the support frame. At the same time, the actuator is pivoted counterclockwise by the lateral extension of the latch and the switch is forced into its OFF position.

DETAILED DESCRIPTION

Figure 1:
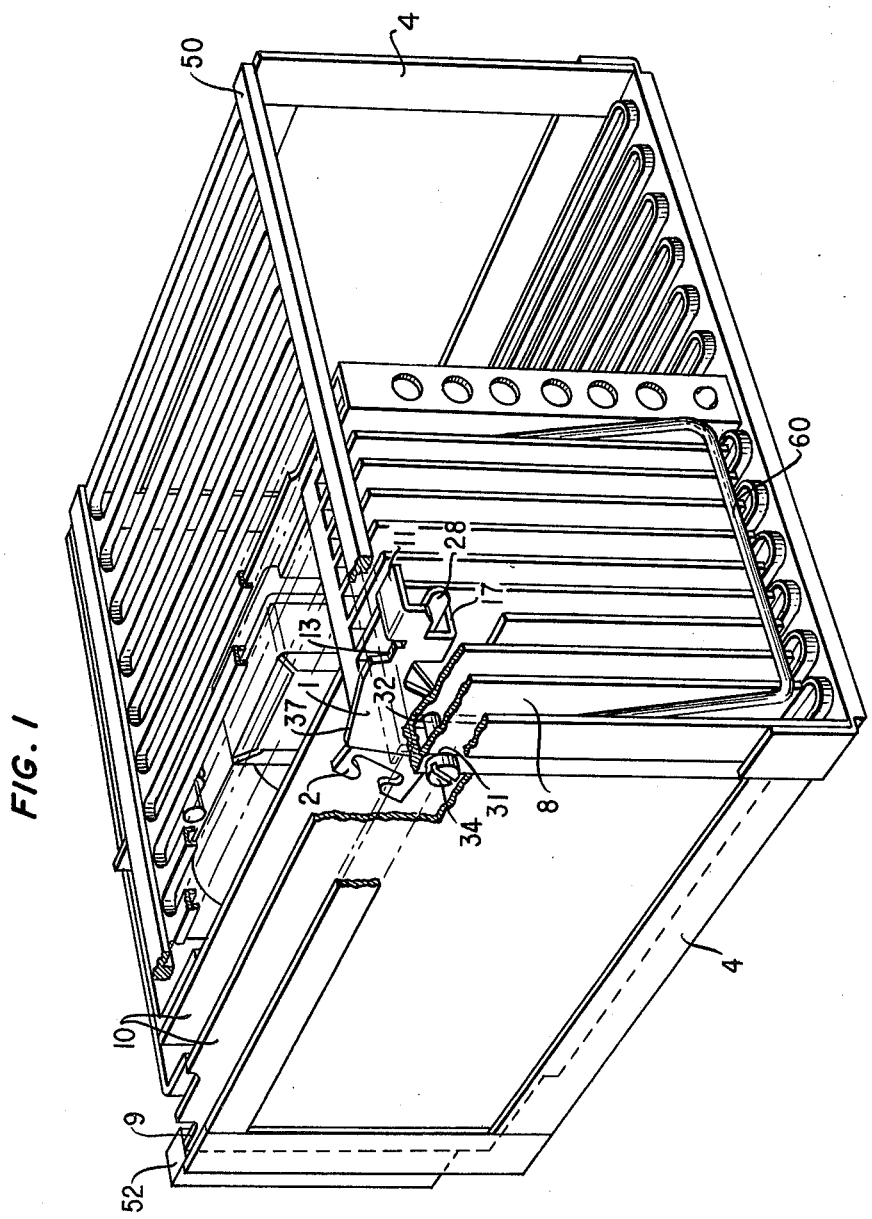
FIG. 1 shows a perspective view of an electronic component module and support frame assembly that employs a latch and switch actuator with sections cut out.

In FIG. 1 an electronic component module, generally designated by reference character 10, includes a plurality of mounted components, a connecting member 9, and heat sink 8 adapted to aid in the removal of heat from the module components. Connecting member 9 is adapted to be received by mating connector 52 in the support frame. Switch 7, removed from FIG. 1 but shown in FIGS. 2, 3, 4, and 5, is connected to the electronic components of module 10 to control the application of electric power to module 10. Latch 1 and switch actuator 2 are mounted on a common pivot, which pivot is attached to heat sink 8 by means of screw 34 inserted through apertures 31 and 32 and the common pivot. Support frame 4 incorporates upper fixed member 50 which is in contact with the upper edge of latch 1 during plug-in and removal and when module 10 is fully connected to the support frame. Switch actuator 2 pivots between a first position in which switch 7 is turned off and a second position in which switch 7 is turned on. Latch 1 is adapted to force actuator 2 to its second position during module plug-in and removal, and to allow actuator 2 to be pivoted between its first and second positions when the module is fully engaged with the rack assembly.

Figure 2:
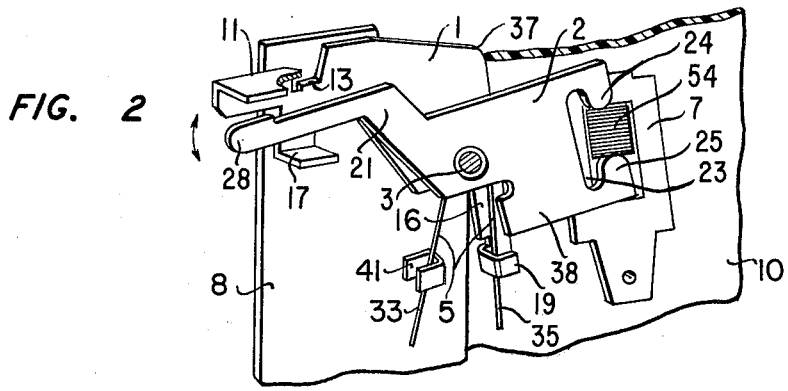
FIG. 2 shows a perspective view of the latch and switch actuator on the electronic component module.
Figure 3:
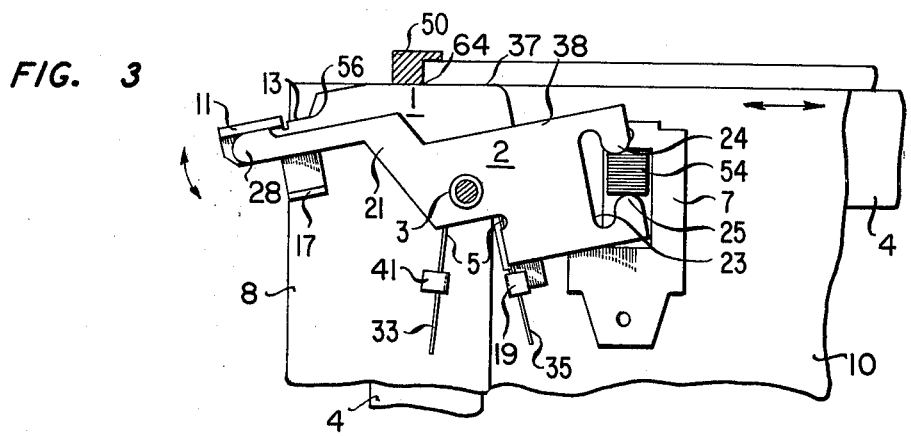
FIG. 3 shows a side view of the latch and switch actuator in position during plug-in or removal of the electronic module from the support frame assembly.
Figure 4:
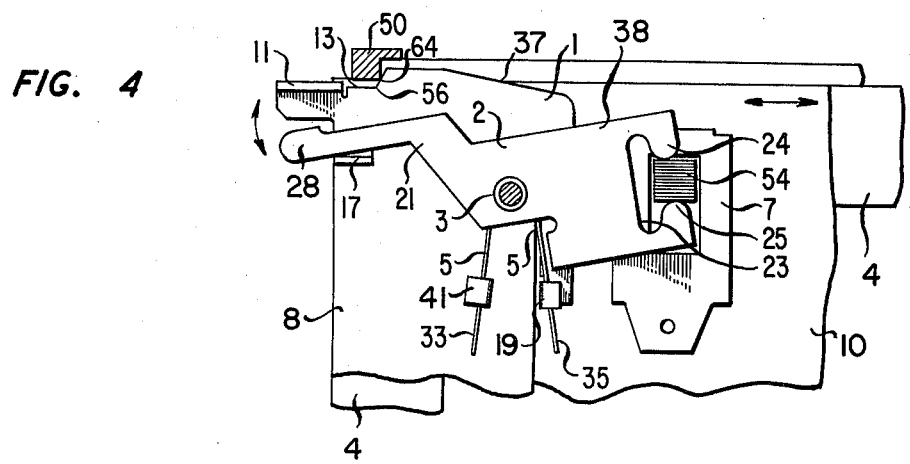
FIG. 4 shows a side view of the latch and switch actuator with the electronic component module in its fully engaged position in the rack assembly and the switch actuator in its OFF position.
Figure 5:
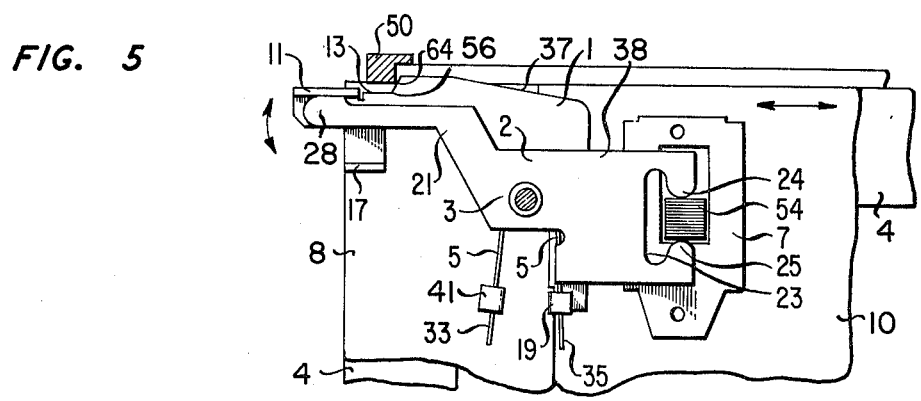
FIG. 5 shows a side view of the latch and switch actuator with the electronic module in its fully engaged position and the switch actuator in its ON position

FIG. 2 shows the latch and switch actuator assembly together with switch 7. The assembly and the switch are mounted on module 10, as depicted in FIG. 1. As shown in FIG. 2, latch 1 and actuator 2 pivot independently about eyelet 3, which eyelet is positioned on heat sink 8 by a pivot screw. Torsion spring 5 has end 33 thereof fixedly held in place on heat sink 8 by hook 41 while spring end 35 is urged by the spring force against hook 19 on downward end 16 of latch 1. Responsive to the force of torsion spring 5, latch 1 is pivotally urged upward in contact with fixed member 50 of frame 4 as shown in FIGS. 3–5. The upper edge of latch 1 includes angular portion 37 and notch 13. Lateral portion 11, adjacent to notch 13, extends over end 28 of actuator 2 and lateral portion 17 of latch 1 extends underneath end 28. Section 38 of actuator 2 on the side of eyelet 3 opposite end 28 includes a recessed portion into which movable member 54 of switch 7 inserts. The recessed portion of actuator 2 comprises an upper protrusion 24 and a lower protrusion 25 between which protrusions the movable member of switch 7 is constrained. The counterclockwise pivoting movement of actuator 2 forces the movable member 54 of switch 7 to slide upward, while the clockwise pivotal movement of actuator 2 forces movable member 54 to slide downward. When member 34 is forced upward, switch 7 is placed in its OFF position and when forced downward, switch 7 is placed in its ON position. The clockwise pivotal movement of actuator 2 is limited by contact of the upward limit of movable member 54 of switch 7. The counterclockwise movement of actuator 2 is constrained by the downward limit of movable member 54.

Referring to FIG. 3, the latch and switch actuator is shown in relation to fixed member 50 during plug-in or removal of connecting member 9 to or from connector 52 of the support frame. In the absence of the latch and switch actuator of the invention, electrical transients may be generated by the initial or terminating contact of the conductors of connecting member 9 with the mating conductors of connector 52 in the position shown in FIG. 3. These transients may adversely affect the interconnecting surfaces and the components in module 10. In accordance with the invention, switch 7 is automatically held in its OFF position during plug-in and removal so that electrical power is removed from module 10 and transient damage is avoided.

As shown in FIG. 3, a portion of latch 1 upper edge 37 abuts and is urged into contact with support frame member 50 responsive to the action of torsion spring 5. With edge 37 in contact with frame fixed member 50, lateral extension 11 of the latch is in its lower position pressed against end 28 of actuator 2. Extension 11 forces actuator 2 to pivot in a counterclockwise direction, which moves protrusion 25 upwardly against switch member 54. Switch movable member 54 is thereby upwardly displaced and switch 7 is held in its OFF position so long as latch edge 37 is in contact with fixed support frame member 50.

When contact between the conducting fingers of connecting member 9 and the mating conductors of connector 52 is completed, notch 13 is beneath and in contact with fixed support member 50 as a result of the action of torsion spring 5 as shown in FIG. 4. Latch 1 is thereby displaced upwardly. Lateral section 11 of latch 1 is raised and removed from end 28 of actuator 2. Actuator 2 remains in its lower pivotal position whereby switch 7 is maintained in its OFF condition. In this position of module 10, end 28 of actuator 2 can be manually pressed upwardly to pivot actuator 2 clockwise. Responsive to the clockwise pivotal movement of actuator 2, protrusion 24 of actuator 2 is forced downward and the movable member of switch 7 is displaced downwardly to its ON condition. Electric power is now applied to module 10.

FIG. 5 shows the latch and switch actuator assembly when module 10 is in its connected position but with end 28 of actuator 2 upwardly displaced so that it is in contact with lateral extension 11 of latch 1. In this position, switch 7 is in its ON condition. With module 10 in its connected position, actuator 2 can be manually operated independently of latch 1 to turn switch 7 on or off.

In its fully engaged position, module 10 is restrained from sidewise and vertical movement by contact with support frame 4. Module 10 may be removed from support frame 4 by pulling handle 60 shown in FIG. 1. As shown in FIGS. 4 and 5, latch 1 is operative to lock module 10 into its fully engaged position so that the pull of handle 60 is ineffective to extract the module. Notch 13 of latch 1 comprises a generally horizontal section and an adjacent angular section intersection at corner 56. In the fully engaged position, the center point of the notch angular section is urged into contact with corner 64 of fixed frame support member 50 by torsion spring 5. Thus, when the module is pulled away from support frame 4 a force is directed from corner 64 against the angular section of notch 13. The direction of the angular section is selected so that a line normal to the angular section at its point of contact with fixed member corner 64 passes above eyelet 3. The force exerted from corner 64 against the angular section is directed along the normal line. Therefore, the force exerted as a result of the pulling of handle 60 causes a clockwise turning moment in latch 1. But clockwise movement of latch 1 is restrained by fixed member 50. Thus, latch 1 and module 10 are fixed whereby module 10 is locked into its engaged position.

To remove module 10 from support frame 4, latch 1 is depressed. Responsive to the downward force, latch 1 pivots in a counterclockwise direction and notch 13 is displaced to clear fixed member 50. By selecting an angular section rather than a vertical section for notch 13, the force required to depress latch 1 is reduced. With notch 13 removed from fixed member 50, module 10 can be extracted from frame 4 by pulling handle 60. The depression of latch 1 causes section 11 of the latch to be pressed downward against end 28 of actuator 2. The resulting counterclockwise pivotal movement of actuator 2 forces movable switch member 54 to slide to its upper position and switch 7 is turned off. Electrical power is removed from module 10 through the contacts of switch 7 prior to the extraction of the module from support frame 4. The contacts of switch 7 are selected to permit transients thereacross without damage. Similarly, transients during module insertion are applied to the contacts of switch 7. Thus, transient damage to the connecting member of module 10 and module 10 components is avoided.

While the invention has been described with reference to a particular embodiment, it is to be understood that various modifications can be made without departing from the spirit and scope of the invention.

What is claimed is:

1. A switch assembly for removing electrical power from an electronic component module during insertion and removal of the module connector member with a mating connector member of a support frame comprising a switch device fixedly mounted on said module comprising a member movable to an OFF position in which said switch is in its OFF state for preventing electrical power from being applied to said module and movable to an ON position in which said switch is in its ON state for permitting electrical power to be applied to said module, a switch actuator pivotally mounted on said module and movably engaged with said switch device member for pivoting about said pivotal mount to a first position to move said switch device member to its ON position and for pivoting about said pivotal mount to a second position to move said switch device member to its OFF position, and means mounted on said module abutting against said support frame for restricting said actuator to its second position during insertion and removal of said module connector member to said frame connector member.

2. A switch assembly according to claim 1 wherein said actuator restricting means comprises a latch pivotally mounted in common with said actuator on said module, said latch being placed adjacent to and in parallel relation with said actuator, said support frame comprising a fixed member abutting said latch, means for forcing said latch to slide against said fixed support frame member during said insertion and removal, said latch further comprising a first lateral member projecting over said actuator for restraining said actuator to its second position during insertion and removal responsive to said latch slidably bearing against said support frame fixed member.

3. A switch assembly according to claim 2 wherein said latch forcing means comprises means for spring loading said latch against said fixed supporting frame member.

4. A switch assembly according to claim 3 wherein said latch further comprises a notched section in contact with said support frame fixed member when said module connector member is fully engaged with said support frame connector member, said latch lateral projecting member being removably displaced from said actuator by the engagement of said notch with said fixed support frame member to permit pivotal movement of said actuator between its first and second positions.

5. A switch assembly according to claim 4 wherein said latch notched section comprises a generally horizontal portion adjacent to said latch projecting member and an upwardly angular portion meeting said horizontal portion at a corner, said angular portion being urged against a corner of said fixed member when said module is fully engaged with said support frame, the direction of said angular portion being selected so that the force of said angular portion against said fixed member corner generates a clockwise moment in said latch whereby said module is restrained in its fully engaged position.

6. In an electronic module assembly having at least one electronic component module with a module connecting member adapted to be received by a support frame connector member, a latch and switch actuator assembly comprising a latch pivotally mounted on said module adapted to abut a support frame fixed member, means for forcibly engaging said latch against said support frame fixed member during plug-in and removal of said module connecting member with said frame connector member, a switch device having a projecting element movable between a fixed ON position in which said switch device is in its ON state and a fixed OFF position in which said switch device is in its OFF state, a switch actuator pivotally mounted on said module in common with said latch, said actuator being in movable contact with said switch projecting element and pivotable on said module between a first position in which said switch is in said ON state and a second position in which said switch is in said OFF state, said latch comprising means for forcibly maintaining said actuator in its second position during said plug-in and removal.

7. In an electronic module assembly having at least one electronic component module with a connector member adapted to be inserted into a support frame connector member, a latch and switch actuator assembly according to claim 6 wherein said forcibly maintaining means comprises a laterally projecting section of said latch in contact with said switch actuator during said plug-in and removal for holding said switch actuator in its second position.

8. In an electrical module assembly having at least one electronic component module with a connecting member adapted to be received by a support frame connector member, a latch and switch actuator assembly according to claim 7 wherein said latch forcibly engaging means comprises means for spring loading said latch against said support frame fixed member and said latch further comprises a notched section for removably displacing said latch projecting section from said actuator when said module connecting member is fully engaged with said support frame connector member whereby said actuator can be pivoted between its first and second positions.

9. In combination, an electronic component module having a connector member, a module support frame having a connector member and a fixed member adjacent to said module, a switch fixedly mounted on said module having a projecting element adapted to slide between a fixed ON position for maintaining said switch in its ON state and a fixed OFF position for maintaining said switch in its OFF state, a switch actuator pivotally mounted on said module having a recessed end on a first side of said pivot mounting in contact with said switch projecting element and a section on the second side of said pivot mounting for pivoting said actuator between a first position in which said switch element is in its fixed ON position and a second position in which said switch projecting element is in its fixed OFF position, a latch pivotally mounted on said component module in common with said switch actuator adjacent to said actuator and in parallel relation with said actuator, said latch abutting said adjacent support frame fixed member and being spring loaded to be in sliding contact with said fixed member during plug-in and removal of said module with said support frame, said latch comprising a lateral section projecting over said actuator second side for pivoting said actuator on said module pivot mounting to its second position during plug-in and removal of said module connector member with said frame connector member, said switch element being moved to its OFF state responsive to said actuator in its second position to disconnect electrical power from said module during said plug-in and removal.

10. The combination according to claim 9 wherein said latch comprises a notch section for removably displacing the latch lateral section from said switch actuator second side when said module connector member is fully engaged with said support frame connector member whereby said actuator can be pivoted on said module between its first and second positions.

11. The combination according to claim 10 wherein said notch section comprises a horizontal portion adjacent to said lateral projecting section and an angular portion meeting said horizontal portion at a corner, said fixed member having an edge in contact with said angular portion when said module connector member is fully engaged with said support frame connector member, the direction of said angular portion being selected so that the force of contact between said fixed member edge in contact with said angular portion generates a clockwise moment in said latch whereby said module is locked into its fully engaged position with said support frame.

12. A switch assembly on an electronic component module for removing electrical power from said module during engagement and disengagement of said module with a support frame comprising a switch device fixedly mounted on said module, said switch device having a member movable between an ON position in which said switch is in its ON state and an OFF position in which said switch is in its OFF state, a switch actuator pivotally mounted on said module and movably engaged with said switch device movable member for pivoting on said module between a first position holding said switch device in its ON state and a second position holding said switch device in its OFF state, and latching means pivotally mounted on said module in common with said actuator and abutting a fixed member of said support frame for restricting said actuator to its second position during said engagement and disengagement of said module with said support frame whereby said switch is maintained in its OFF state during said engagement and disengagement.

* * * * *